US007663446B1

(12) United States Patent  
Surin (10) Patent No.: US 7,663,446 B1
(45) Date of Patent: Feb. 16, 2010

(54) ADJUSTABLE SUPPLY VOLTAGE IN A VOLTAGE CONTROLLED OSCILLATOR (VCO) FOR WIDE RANGE FREQUENCY COVERAGE

(75) Inventor: Danny Terrance Surin, Perak (MY)

(73) Assignee: Marvell International Ltd., Hamilton (BM)

( * ) Notice: Subject to any disclaimer, the term of this patent is extended or adjusted under 35 U.S.C. 154(b) by 107 days.

(21) Appl. No.: 11/820,235

(22) Filed: Jun. 18, 2007

Related U.S. Application Data

(60) Provisional application No. 60/815,931, filed on Jun. 23, 2006.

(51) Int. Cl.
*H03L 7/099* (2006.01)
(52) U.S. Cl. .................................. 331/185; 331/177 R
(58) Field of Classification Search .................. 331/185, 331/57, 175, 186, 177 R
See application file for complete search history.

(56) References Cited

U.S. PATENT DOCUMENTS 5,635,879 A * 6/1997 Sutardja et al. ............... 331/57
5,686,867 A * 11/1997 Sutardja et al. ............... 331/57
6,661,728 B2 * 12/2003 Tomita et al. ............ 365/189.09

* cited by examiner

*Primary Examiner*—Daniel D Chang (57) ABSTRACT

Methods, algorithms, architectures, circuits, and/or systems for increasing voltage controlled oscillator (VCO) operational frequency ranges are disclosed. In one embodiment, a VCO can include 2n+1 transconductors configured to provide an oscillating signal, where $n \geq 1$; a selectable supply voltage coupled to each of the transconductors, where a frequency range of the oscillating signal is related to the selectable supply voltage; and an adjustable input voltage, where a frequency of the VCO depends on a value of the adjustable input voltage. Also, the VCO may include a voltage regulator configured to provide the supply voltage and/or a selecting circuit configured to select a reference voltage (e.g., from the voltage regulator can produce the supply voltage). Embodiments of the present invention can advantageously provide a cost effective approach for enhancing VCO frequency ranges from a singly VCO, suitable for phase-locked loop (PLL) applications.

31 Claims, 9 Drawing Sheets

FIG. 1 (conventional)

ADJUSTABLE SUPPLY VOLTAGE IN A VOLTAGE CONTROLLED OSCILLATOR (VCO) FOR WIDE RANGE FREQUENCY COVERAGE

RELATED APPLICATIONS

This application claims the benefit of U.S. Provisional Application No. 60/815,931, filed Jun. 23, 2006, which is incorporated herein by reference in its entirety.

FIELD OF THE INVENTION

The present invention generally relates to the field of clock generating circuits. More specifically, embodiments of the present invention pertain to methods, algorithms, architectures, circuits, and/or systems for enhancement of voltage controlled oscillator (VCO) frequency coverage.

DISCUSSION OF THE BACKGROUND

Figure 1:
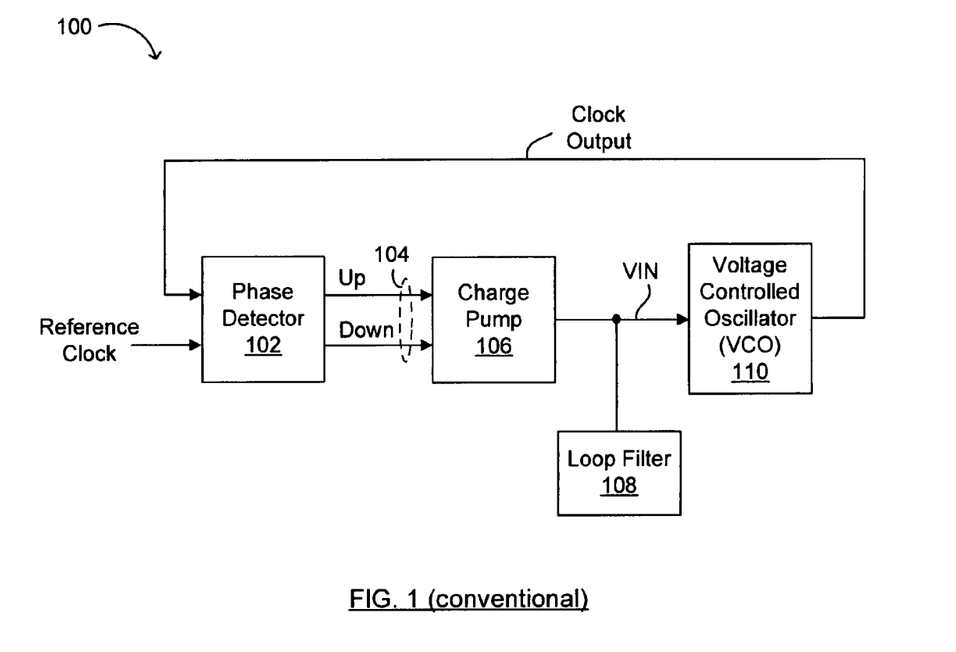
FIG. 1 is a schematic block diagram showing a conventional phase-locked loop (PLL) structure.

In many digital communication systems, phase-locked loop (PLL) circuits are employed in applications such as clock synthesis and/or clock or data signal recovery (e.g., from a nonreturn-to-zero (NRZ)-encoded high speed serial data stream). Referring now to FIG. 1, a block schematic diagram shows a conventional PLL circuit 100 using a phase detector to compare a clock output to a reference clock. Phase detector 102 can receive a reference clock and a clock output, while providing up/down controls 104 to charge pump 106. Voltage controlled oscillator (VCO) 110 can receive an input voltage or frequency control signal VIN from charge pump 106 and/or loop filter 108, and provides the clock output.

Such VCOs are typically used in PLL applications, and may be implemented in application-specific integrated circuit (ASIC) designs, for example. Further, modern ASICs using several different clock domains may need a corresponding number of clock generators. For example, where the clock domains may not be integral with each other (e.g., no frequency divider can produce a specific, related frequency), a separate PLL may be needed. In many cases, the time range in which such clocks are generated can be from hundreds of kHz to the GHz range. Thus, the physical design or layout may require different PLLs to cover each different frequency range.

Accordingly, a drawback of conventional VCO and PLL design approaches is that two or more separate VCOs may be needed to cover a relatively wide frequency spectrum. Such designs can increase die area, thus resulting in increased associated costs. However, an efficient circuit and/or approach for increasing the frequency range of a VCO could provide advantages over a conventional two-VCO approach.

SUMMARY OF THE INVENTION

Embodiments of the present invention relate to methods, algorithms, architectures, circuits, and/or systems for enhancement of voltage controlled oscillator (VCO) frequency coverage.

In one embodiment, a VCO can include: 2n+1 transconductors configured to provide an oscillating signal, where $n \geq 1$; a selectable supply voltage coupled to each of the transconductors, where a frequency range of the oscillating signal is related to the selectable supply voltage; and an adjustable input voltage, where a frequency of the VCO depends on a value of the adjustable input voltage. Also, a selecting circuit can be used to select from among a plurality of reference voltages in order to provide the supply voltage via a voltage regulator, for example. In addition, the selectable supply voltage may comprise a common supply voltage.

In another embodiment, a method of controlling a frequency of a VCO can include the steps of: selecting one of a plurality of reference levels to provide a supply voltage to each of (2n+1) transconductors in the VCO, where $n \geq 1$, and the supply voltage corresponds to a frequency range of the VCO; and inputting an adjustable bias voltage to a control path in the VCO, where the control path is coupled to each of the transconductors, and the frequency of the VCO is dependent on the adjustable bias voltage. In certain embodiments, the control path comprises a current or voltage control path.

In another embodiment, a phase-locked loop (PLL) can include: a VCO with (2n+1) transconductors configured to provide an oscillating signal, where $n \geq 1$; and a supply generator coupled to the VCO, where the supply generator can provide a selectable supply voltage to each of the transconductors, and where a frequency range of the oscillating signal is related to the selectable supply voltage.

According to various embodiments of the present invention, an architecture or circuit for VCO frequency range enhancement can include a selecting circuit and a voltage regulator coupled to a common supply node for differential transconductors in the VCO. Of course, in some embodiments, the selecting circuit may be integrated or otherwise combined with the voltage regulator. In any event, a supply voltage of the common supply node can be adjustable in order to enhance a frequency coverage of the VCO. Accordingly, a same VCO design or common VCO circuit, and thus a same PLL design or circuit, can be used to cover a wider range of frequencies, as compared to conventional approaches.

The invention further relates to system-level implementations of the present architecture, method, and circuit. Embodiments of the present invention can advantageously provide a cost effective approach for increasing VCO frequency ranges, suitable for PLL applications. Further, embodiments of the present invention can advantageously provide control and/or configuration of a single VCO for use over a relatively wide frequency spectrum, as compared to conventional approaches that typically require two or more VCOs. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may the terms "flip-flop," "latch" and "register," and the terms "connected to," "coupled with," "coupled to," and "in communication with," (which may refer to direct or indirect connections, couplings, or communications) but these terms are generally given their art-recognized meanings herein. Finally, in the context of the present invention, the terms "adjustable" and "selectable" are used somewhat interchangeably, but in general, "selectable" refers to an ability to assume one of a limited number of substantially discrete states, and "adjustable" refers to an ability to have one of a theoretically infinite number of values (e.g., in a so-called "analog" range of values).

An Exemplary Voltage Controlled Oscillator (VCO)

Figure 2:
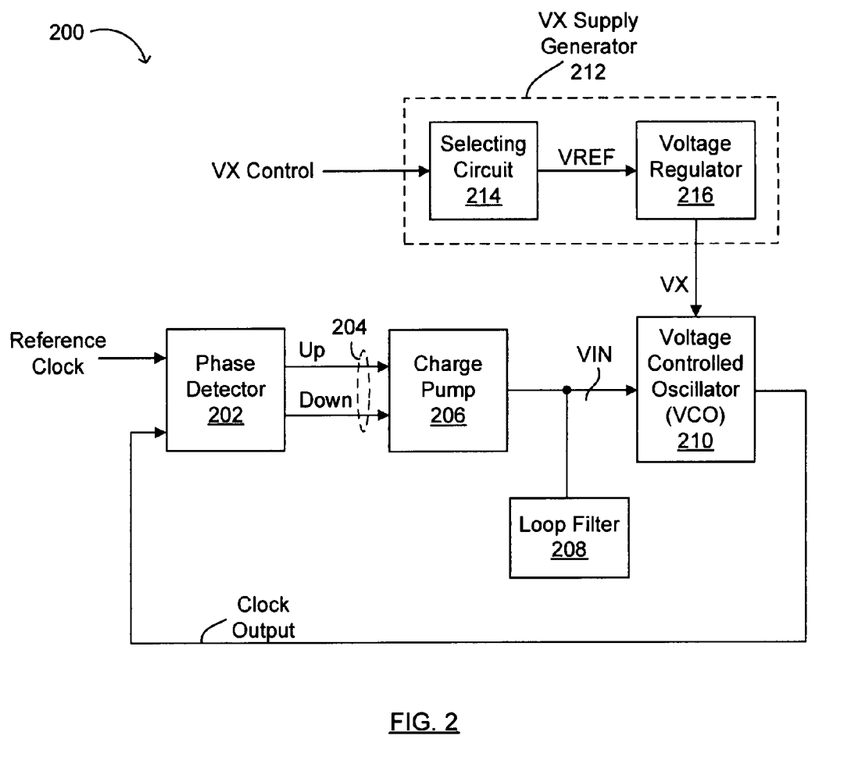
FIG. 2 is a schematic block diagram showing an exemplary PLL arrangement in accordance with embodiments of the present invention.

Referring now to FIG. 2, a schematic block diagram shows an exemplary PLL arrangement 200 in accordance with embodiments of the present invention. Phase detector 202 can receive a reference clock and a clock output, while providing up/down controls 204 to charge pump 206. VCO 210 can receive input voltage or frequency control signal VIN from charge pump 206 and/or loop filter 208, and may provide the clock output.

In addition, VX supply generator 212 can provide a voltage supply, VX, to VCO 210. In accordance with embodiments of the present invention, VX can be adjustable or selectable, and a frequency, or range of frequencies, of the clock output can be related to a level of voltage supply VX. In VX supply generator 212, selecting circuit 214 can receive VX control, and can supply a reference voltage, VREF. Voltage regulator 216 can receive VREF, and can provide VX to VCO 210, for example. In this fashion, VX control can be used for selecting an appropriate VREF level output of selecting circuit 214, and a subsequent VX level. Of course, other bias transistors and/or current/voltage control circuits can be included between VX supply generator 212 and the individual stages in VCO 210, for example.

Figure 3:
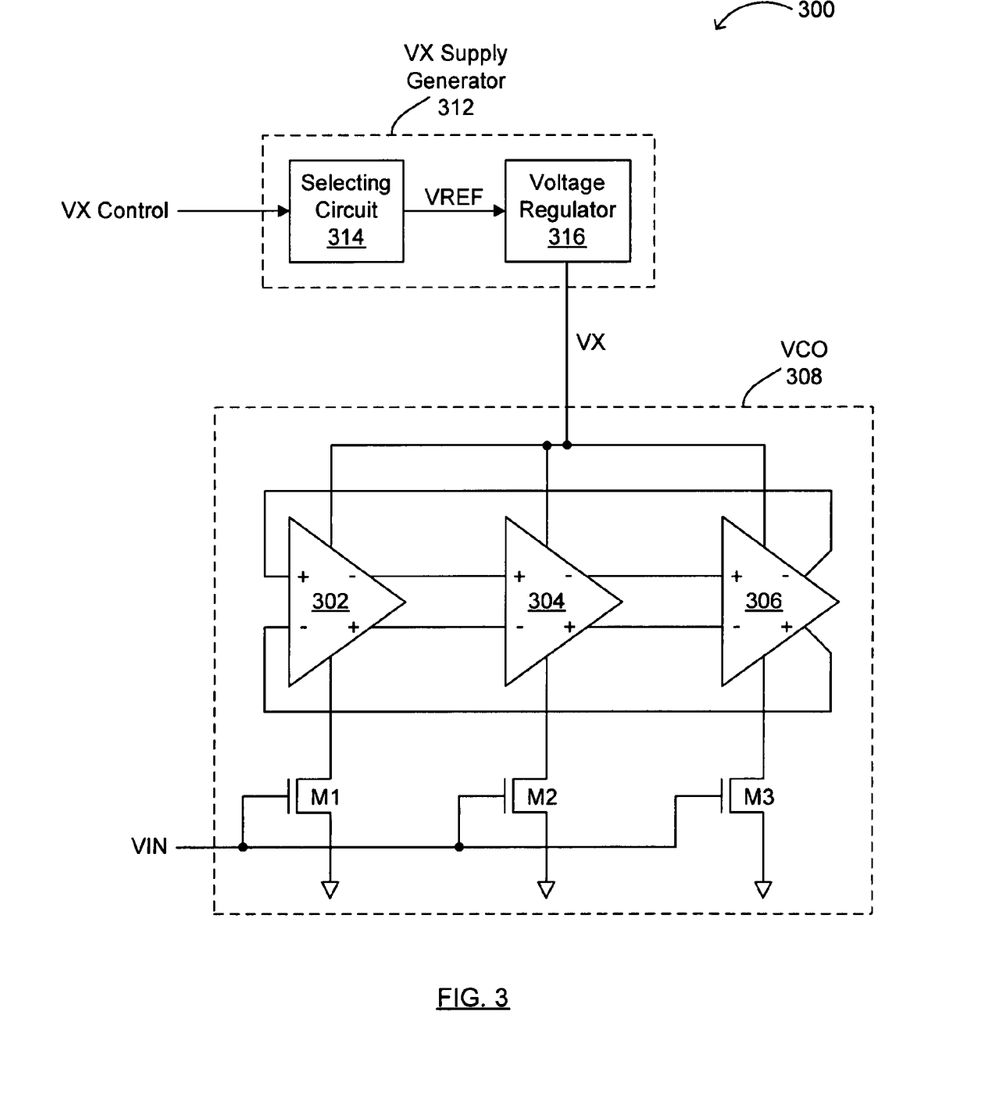
FIG. 3 is a schematic block diagram showing an exemplary supply generator and voltage-controlled oscillator (VCO) arrangement in accordance with embodiments of the present invention.

Referring now to FIG. 3, a schematic block diagram shows an exemplary supply generator and VCO arrangement 300 in accordance with embodiments of the present invention. VCO 308 can include differential transconductors 302, 304, and 306, for example. As one skilled in the art will recognize, any suitable odd number of such differential, or single-ended, transconductors can be utilized in accordance with various embodiments of the invention. For example, increasing the number of differential transconductor stages can lower a frequency of oscillation because of an additional propagation delay through the increased number of stages. An increased number of transconductor stages may improve the stability of the VCO, and such frequency variations may depend on transistor sizes and/or circuit implementations within each transconductor stage.

In order for oscillation to occur, a negative output from one transconductor can connect to a positive input of another transconductor. Thus, positive and negative outputs of differential transconductor 302 can connect to negative and positive inputs, respectively, of differential transconductor 304. Similarly, positive and negative outputs of differential transconductor 304 can connect to negative and positive inputs, respectively, of differential transconductor 306, and positive and negative outputs of differential transconductor 306 can connect to negative and positive inputs, respectively, of differential transconductor 302.

Each of differential transconductors 302, 304, and 306 can also have a pull-down path controllable by input voltage VIN for current control in the respective differential transconductor. Alternatively, other types of current or voltage control paths can be used, such as pull-up paths, or any suitable combination of pull-up and/or pull-down paths for bias control. In this particular example, a pull-down path of differential transconductor 302 can include NMOS transistor M1 coupled to a ground rail (e.g., VSS) and having a gate connected to VIN. Similarly, a pull-down path of differential transconductor 304 can include NMOS transistor M2 coupled to VSS and with a gate connected to VIN, and a pull-down path of differential transconductor 306 can include NMOS transistor M3 coupled to VSS, and with a gate of M3 connected to VIN. Further, input voltage VIN can connect to a charge pump output and a loop filter in a PLL configuration (see, e.g., FIG. 2).

As discussed above, VCOs can include odd stages of differential transconductors (e.g., three stages 302, 304, and 306). In conventional approaches, supply voltage VX to the transconductors can be fixed at a constant voltage, such as the rail supply voltage (e.g., VDD). However, for low jitter, high performance PLLs, power supplies for the differential transconductors can be internally regulated to provide noise rejection and constant voltage across process, voltage, and temperature (PVT) conditions. Further, in accordance with various embodiments of the invention, VX supply generator 312 can include selecting circuit 314 that can receive VX control for selecting supply voltage VX using a reference voltage, VREF.

The particular example VCO 308 shown is an N-type VCO because of the pull-down paths formed by NMOS devices M1, M2, and M3. Other types of VCOs can include P-type VCOs, whereby PMOS devices may be included to control a current in the path between the voltage regulator 316 and differential transconductors 302, 304, and 306, for example. In either case, regulating voltage supply VX to multiple differential transconductors (e.g., 302, 304, and 306) can reduce the jitter of the VCO oscillation frequency. Further, voltage regulator 316 may include a bandgap reference and/or the circuit may use a feed-forward bias current cancellation in conjunction with a low output impedance buffer, for example. Such a low output impedance buffer may comprise an operational amplifier with a positive input coupled to a reference voltage (e.g., VREF) and a negative input coupled to its own output and regulated supply node VX, for example. In any event, voltage regulator 316 can be configured to provide a relatively stable VX value over a range of operating conditions, processing/manufacturing conditions, and design variations or "corners" (e.g., across variations in processing, voltage and temperature [PVT] conditions).

As shown, voltage regulator 316 can receive VREF, and may provide VX to VCO 308, for example. Also, VX control can be provided by any suitable circuit or method. For example, control logic using external device pins may be used to generate VX control. Alternatively, laser fuses may be used to control logic signals in generating VX control. In any event, a user can change a level of supply voltage VX using VX control signals. Alternatively, selecting circuit 314 may be integrated into or otherwise combined with voltage regulator 316, for example. However, any suitable means of controlling a selection of a different reference, or other voltage, level can be utilized in accordance with embodiments of the present invention for selecting VX.

VCO frequency coverage, or a range of VCO frequencies having linear circuit operation, can be dependent on a voltage supply (e.g., on node VX) of the differential transconductors (e.g., 302, 304, and 306). As discussed above, conventional approaches typically employ a fixed supply voltage to differential transconductors in a VCO. In accordance with embodiments of the present invention, a VCO having wider frequency coverage, as compared to conventional approaches, can include a controlled usage or setting of a supply voltage for such differential transconductors.

In accordance with embodiments of the present invention, a voltage supply level to differential transconductors in a VCO can vary or change at a specific or predetermined time. In this fashion, a relatively constant and low noise voltage may be produced once a desired voltage level is selected or otherwise determined. For example, fundamental circuits, such as voltage regulators with bandgap references, can be used to produce relatively constant and low noise voltage supplies across PVT conditions. Further, in applications where jitter is of relatively low concern, voltage supplies can be directly provided from a board level, where circuitry can be used to tune an intended supply level.

As discussed above, in a conventional VCO design, node VX can be connected to a fixed voltage. However, in accordance with embodiments of the present invention, the voltage at node VX can be adjustable. For example, if VX is set to 2V for a particular design, VCO 308 may be able to perform with linearity in a frequency range from about 500 MHz to about 1 GHz. With conventional approaches, that VCO would need to be redesigned in order to accommodate a PLL operation of about 400 MHz. However, in accordance with embodiments of the present invention, VX supply generator 312 can provide supply voltage adjustments on node VX in order to change a frequency range of VCO 308 having linear operation. Thus, to accommodate a 400 MHz VCO output frequency, the VX voltage can be reduced accordingly. In this fashion, lowering or raising the voltage at VX can reduce or increase, respectively, the linear operating frequency of VCO 308.

Figure 4:
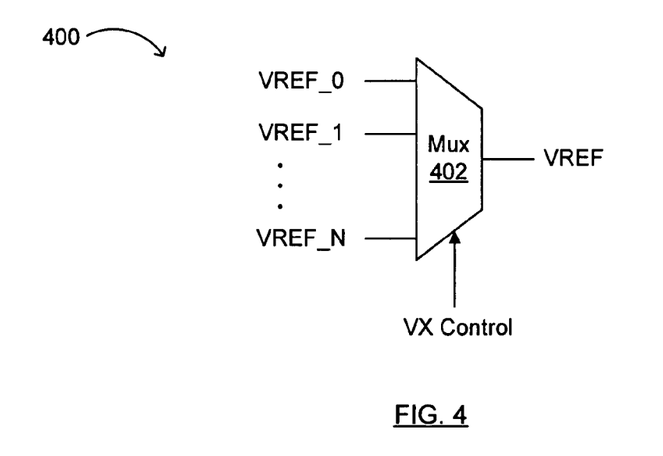
FIG. 4 is a schematic diagram showing an exemplary selecting circuit in accordance with embodiments of the present invention.

Referring now to FIG. 4, an exemplary schematic diagram shows a selecting circuit 400 in accordance with embodiments of the present invention. Input reference levels VREF_0, VREF_1, and so on through VREF_N can connect to multiplexer (MUX) 402. Mux 402 can include pass gate logic, an arrangement of standard logic gates, or precharge/discharge logic, for example. Control signal VX Control can enable selection of one of VREF_0, VREF_1, . . . VREF_N to pass to VREF.

Under different operating conditions or modes of operation, an integrated circuit (or one or more functional blocks of circuitry thereon) may employ a first clock or timing signal having a first, relatively low frequency (e.g., in the range of 200 kHz to 500 MHz) in a first mode, and a second clock or timing signal having a second, relatively high frequency (e.g., in the range of 100 MHz to 4 GHz) in a second mode. Naturally, the number of modes and the frequency range for each mode may vary with the application. Thus, mux control signal VX Control may be determined by a controller or processor configured to determine an operational mode (or time domain) of the integrated circuit (or functional circuit block [s] thereof) correlated to a predetermined or desired frequency range associated with one of the reference levels VREF_0, VREF_1, . . . VREF_N.

However, as one skilled in the art will recognize, any suitable circuit to implement such selection can be used as the selecting circuit in accordance with various embodiments of the invention. For example, circuits that utilize other digitally selectable elements or reference values may also be used. Further, such circuitry in accordance with various embodiments of the invention can be fully adjustable, such as including "on-the-fly" adjustability during VCO and/or PLL operation.

An Exemplary Method of Controlling a Frequency of a VCO

Figure 5:
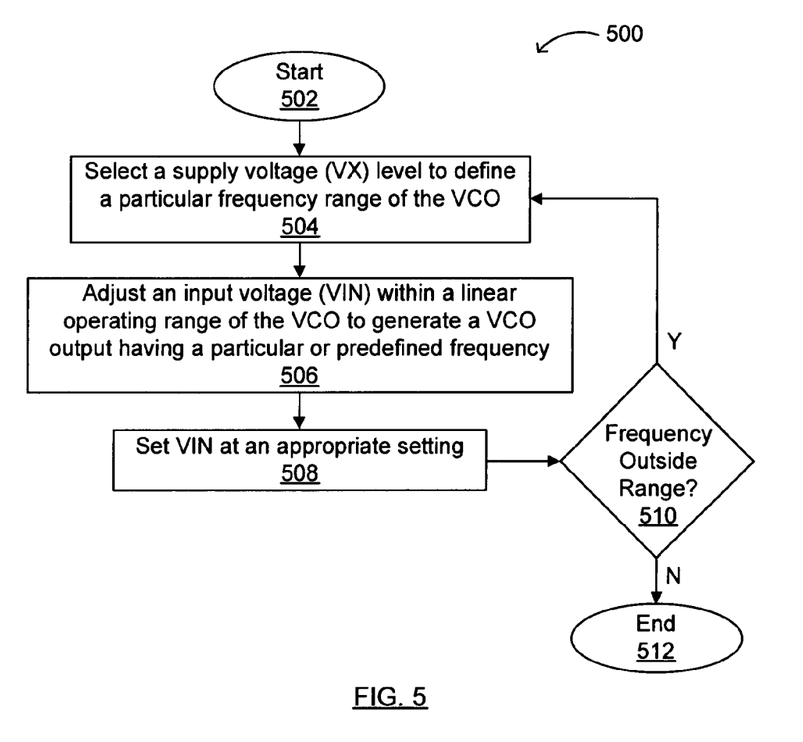
FIG. 5 is a flow diagram showing an exemplary method of adjusting a frequency coverage using a supply voltage in accordance with embodiments of the present invention.

Referring now to FIG. 5, a flow diagram shows an exemplary method 500 of adjusting a frequency coverage using a supply voltage in accordance with embodiments of the present invention. The flow can begin (502) and a supply voltage (VX) level can be selected to define a particular frequency range for the VCO (504). Thereafter, an input voltage (VIN) level may be adjusted within a linear operating range of the VCO (e.g., as defined by a graph plotting the VCO frequency vs. input voltage) to generate a VCO output having a particular or predefined frequency (506). Thus, the clock output frequency can be observed to find an appropriate VIN setting, or range of settings, within a linear range of VCO operation to provide or generate a desired frequency. Input voltage VIN can then be set at an appropriate setting (508). However, if a frequency outside the selected frequency range is desired (510), the level of VX can be changed or re-selected to control the clock output frequency range (504), then VIN may be varied or adjusted again (506, 508) within a linear range of the VCO to arrive at a VCO output having a particular or predefined frequency within the new range (510), and the flow can complete (512).

An Exemplary Integrated Circuit Including a PLL

Figure 6:
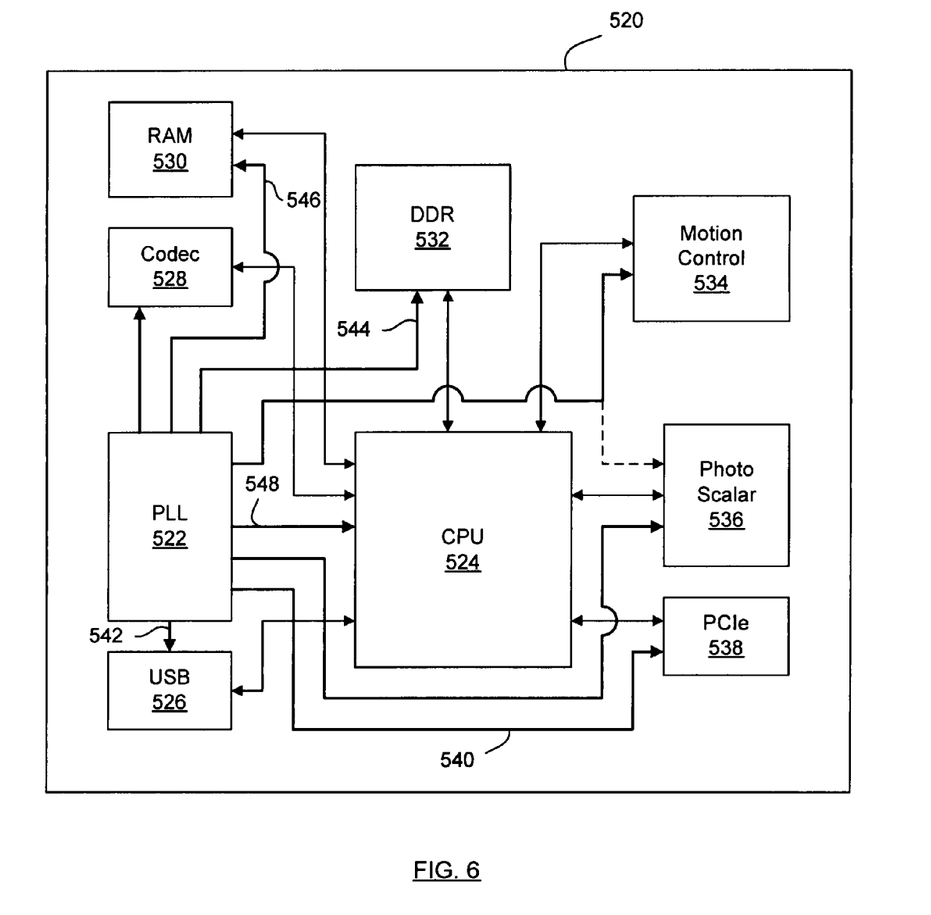
FIG. 6 is a schematic block diagram showing an exemplary integrated circuit incorporating a PLL in accordance with embodiments of the present invention.

Referring now to FIG. 6, a schematic block diagram shows an exemplary integrated circuit arrangement 520 in accordance with embodiments of the present invention. PLL block 522 (which may comprise the PLL 200 of FIG. 2 and/or the VCO of FIG. 3) provides clock signals to other functional blocks in integrated circuit 520, including central processing unit (CPU) 524, universal serial bus (USB) interface and/or processing block 526, coding/decoding (CODEC) block 528, first memory block (e.g., RAM) 530, second memory block or memory controller (e.g., DDR) 532, motion control block 534, photo scalar block 536, and/or peripheral component interface (PCIe) block 538. However, the invention does not require and is not limited to these particular blocks. Also, the integrated circuit 520 may be implemented as an application-specific integrated circuit (ASIC), although it is not so limited.

In accordance with the present invention, PLL block 522 provides one or more clock signals having the same frequency or different frequencies to the various functional blocks in integrated circuit 520. Many integrated circuits may contain different functional blocks operating at different frequencies and/or in different clock domains. For example, PCIe block 538 may operate at a first frequency, whereas USB block 526 may operate at a second frequency the clock that may not be integral with the first frequency (e.g., no frequency divider can produce the second frequency directly from the first frequency). Thus, when PCIe block 538 is selected or enabled for operation, a first reference voltage is selected for input into a VCO in PLL block 522 that results in PLL block 522 outputting a clock signal 540 configured to substantially match an operating frequency of PCIe block 538 (i.e., the first frequency). However, when USB block 526 is selected or enabled for operation, a second reference voltage is selected for input into the VCO in PLL block 522 that results in PLL block 522 outputting a clock signal 542 configured to substantially match an operating frequency of USB block 526 (i.e., the second frequency).

On the other hand, one functional block (e.g., RAM 530) may have an operating frequency that is integral with the operating frequency of a different functional block (e.g., DDR 532). In such a case, a reference voltage may be selected for input into the VCO in PLL block 522 that results in PLL 522 outputting a clock signal 544 configured to substantially match the higher operating frequency (e.g., to DDR 532), and a frequency divider at another output of the PLL 522 can produce the lower frequency clock signal 546 (e.g., for RAM 530). As can be readily ascertained by one skilled in the art, different combinations of dividers and multipliers (some or all of which can be selectable, depending on the functional block[s] selected for operation) can be placed in the PLL block 522 to enable generation of clock signals having a frequency within the operational range of a functional block from the VCO using any one of multiple reference voltages. For example, if CPU block 524 operates at 400 MHz and a first reference voltage applied to the VCO in PLL block 522 results in clock signal 548 having a frequency of 400 MHz, then if a second reference voltage is selected that would otherwise result in clock signal 548 having a frequency of 600 MHz, the PLL output corresponding to clock signal 548 can be divided by 3 (e.g., passed through a "÷3" divider) and multiplied by 2 (e.g., passed through a "×2" multiplier) prior to transmission to the CPU block 524. Thus, by efficient selection and/or design of functional blocks, use of dividers and/or multipliers in PLL block 522, and time-multiplexing of reference voltages in the VCO of PLL block 522 (e.g., coupled to selection of certain functional blocks operating in certain time domains), nearly any number of functional blocks in an integrated circuit can receive effective timing signals from a single PLL.

Exemplary Systems Including the Exemplary VCO

Figure 7A:
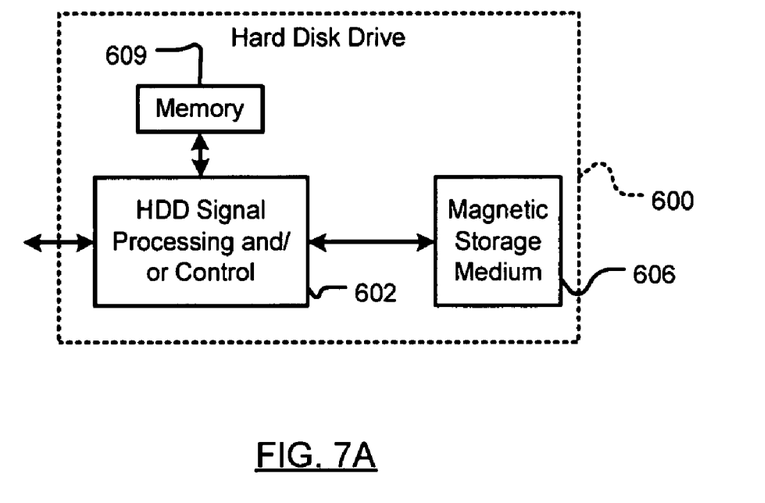
FIGS. 7A-7G are diagrams showing exemplary systems in which the present invention may be used.

Various exemplary implementations of the present invention are shown in FIGS. 7A-7G. Referring now to FIG. 7A, the present invention can be implemented in a hard disk drive (HDD) 600. The present invention may be implemented in either or both signal processing and/or control circuits, which are generally identified in FIG. 7A at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 400 may communicate with a host device (not shown) such as a computer, mobile computing devices such as personal digital assistants, cellular phones, media or MP3 players and the like, and/or other devices via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 7B:
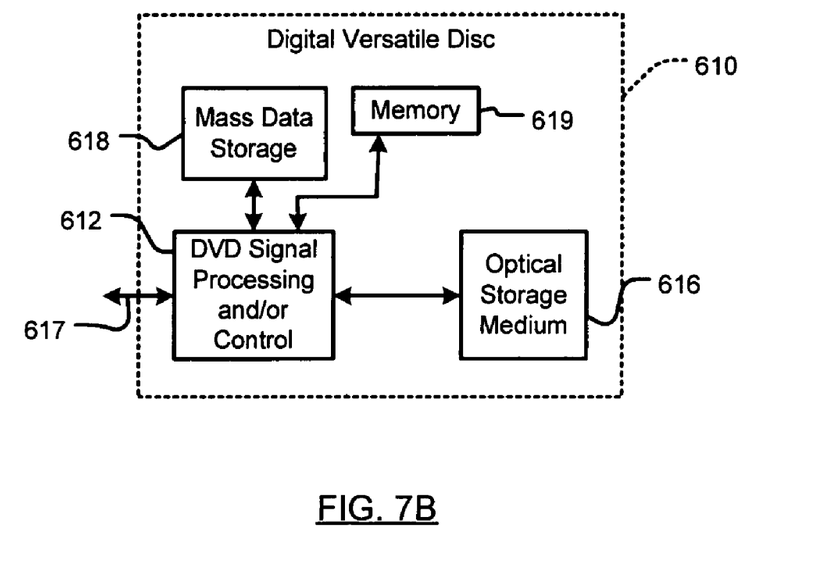

Referring now to FIG. 7B, the present invention can be implemented in a digital versatile disc (DVD) drive 610. The present invention may be implemented in either or both signal processing and/or control circuits, which are generally identified in FIG. 7B at 612, and/or mass data storage of the DVD drive 610. The signal processing and/or control circuit 612 and/or other circuits (not shown) in the DVD 610 may process data, perform coding and/or encryption, perform calculations, and/or format data that is read from and/or data written to an optical storage medium 616. In some implementations, the signal processing and/or control circuit 612 and/or other circuits (not shown) in the DVD 610 can also perform other functions such as encoding and/or decoding and/or any other signal processing functions associated with a DVD drive.

The DVD drive 610 may communicate with an output device (not shown) such as a computer, television or other device via one or more wired or wireless communication links 617. The DVD 610 may communicate with mass data storage 618 that stores data in a nonvolatile manner. The mass data storage 618 may include a hard disk drive (HDD). The HDD may have the configuration shown in FIG. 7A. The HDD may be a mini HDD that includes one or more platters having a diameter that is smaller than approximately 1.8". The DVD 610 may be connected to memory 619 such as RAM, ROM, low latency nonvolatile memory such as flash memory and/or other suitable electronic data storage.

Figure 7C:
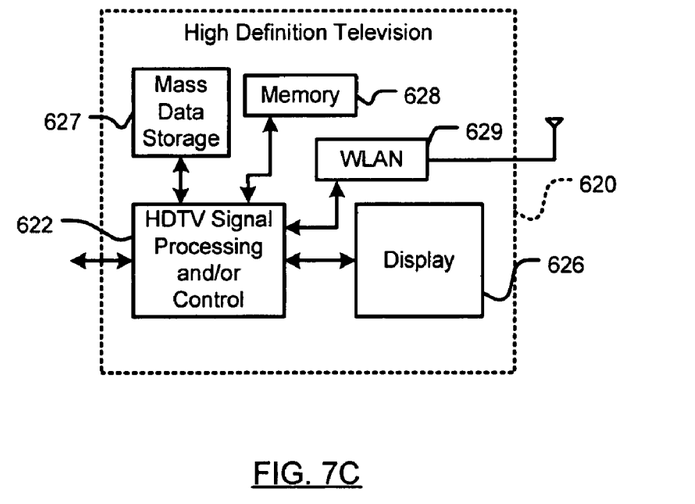

Referring now to FIG. 7C, the present invention can be implemented in a high definition television (HDTV) 620. The present invention may be implemented in either or both signal processing and/or control circuits, which are generally identified in FIG. 7E at 622, a WLAN interface and/or mass data storage of the HDTV 620. The HDTV 620 receives HDTV input signals in either a wired or wireless format and generates HDTV output signals for a display 626. In some implementations, signal processing circuit and/or control circuit 622 and/or other circuits (not shown) of the HDTV 620 may process data, perform coding and/or encryption, perform calculations, format data and/or perform any other type of HDTV processing that may be required.

The HDTV 620 may communicate with mass data storage 627 that stores data in a nonvolatile manner such as optical and/or magnetic storage devices. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 620 may be connected to memory 628 such as RAM, ROM, low latency nonvolatile memory such as flash memory and/or other suitable electronic data storage. The HDTV 620 also may support connections with a WLAN via a WLAN network interface 629.

Figure 7D:
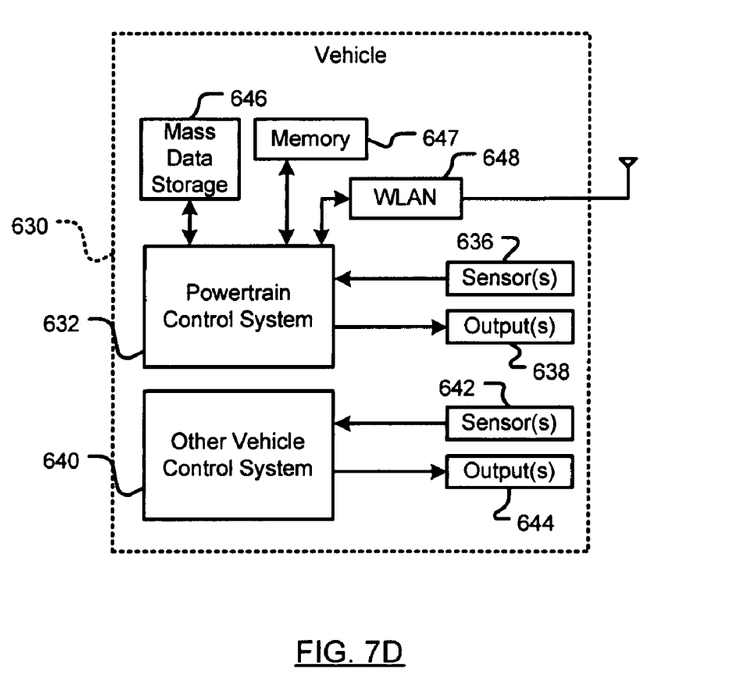

Referring now to FIG. 7D, the present invention implements a control system of a vehicle 630, a WLAN interface and/or mass data storage of the vehicle control system. In some implementations, the present invention can be implemented in a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 640 of the vehicle 630. The control system 640 may likewise receive signals from input sensors 642 and/or output control signals to one or more output devices 644. In some implementations, the control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations benefiting from are contemplated.

The powertrain control system 632 may communicate with mass data storage 646 that stores data in a nonvolatile manner. The mass data storage 646 may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8"The powertrain control system 632 may be connected to memory 647 such as RAM, ROM, low latency nonvolatile memory such as flash memory and/or other suitable electronic data storage. The powertrain control system 632 also may support connections with a WLAN via a WLAN network interface 648. The control system 640 may also include mass data storage, memory and/or a WLAN interface (all not shown).

Figure 7E:
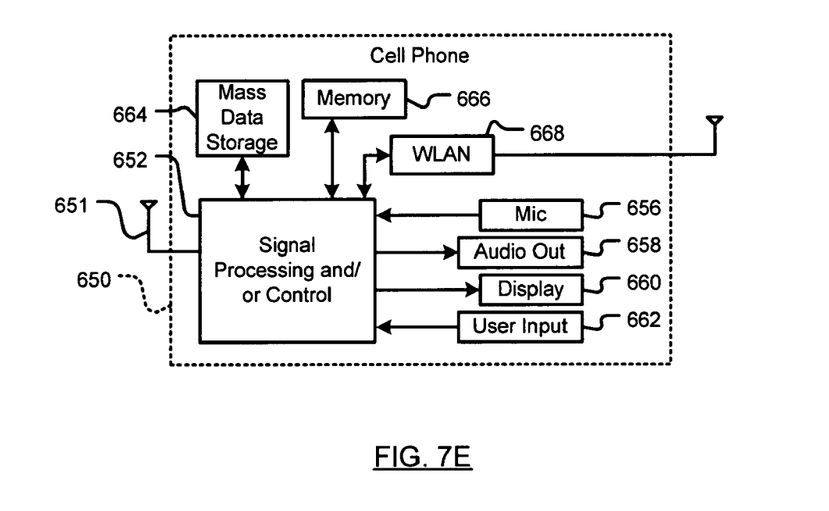

Referring now to FIG. 7E, the present invention can be implemented in a cellular phone 650 that may include a cellular antenna 651. The present invention may be implemented in either or both signal processing and/or control circuits, which are generally identified in FIG. 7E at 652, a WLAN interface and/or mass data storage of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The signal processing and/or control circuits 652 and/or other circuits (not shown) in the cellular phone 650 may process data, perform coding and/or encryption, perform calculations, format data and/or perform other cellular phone functions.

The cellular phone 650 may communicate with mass data storage 664 that stores data in a nonvolatile manner such as optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8"The cellular phone 650 may be connected to memory 666 such as RAM, ROM, low latency nonvolatile memory such as flash memory and/or other suitable electronic data storage. The cellular phone 650 also may support connections with a WLAN via a WLAN network interface 668.

Figure 7F:
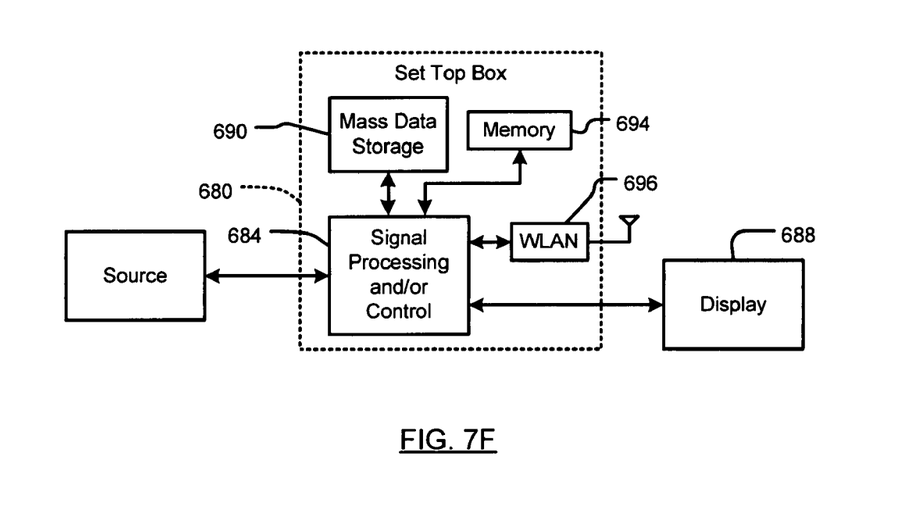

Referring now to FIG. 7F, the present invention can be implemented in a set top box 680. The present invention may be implemented in either or both signal processing and/or control circuits, which are generally identified in FIG. 7F at 684, a WLAN interface and/or mass data storage of the set top box 680. The set top box 680 receives signals from a source such as a broadband source and outputs standard and/or high definition audio/video signals suitable for a display 688 such as a television and/or monitor and/or other video and/or audio output devices. The signal processing and/or control circuits 684 and/or other circuits (not shown) of the set top box 680 may process data, perform coding and/or encryption, perform calculations, format data and/or perform any other set top box function.

The set top box 680 may communicate with mass data storage 690 that stores data in a nonvolatile manner. The mass data storage 690 may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8"The set top box 680 may be connected to memory 694 such as RAM, ROM, low latency nonvolatile memory such as flash memory and/or other suitable electronic data storage. The set top box 680 also may support connections with a WLAN via a WLAN network interface 696.

Referring now to FIG. 7F, the present invention can be implemented in a media player 700. The present invention may be implemented in either or both signal processing and/or control circuits, which are generally identified in FIG. 7G at 704, a WLAN interface and/or mass data storage of the media player 700. In some implementations, the media player 700 includes a display 707 and/or a user input 708 such as a keypad, touchpad and the like. In some implementations, the media player 700 may employ a graphical user interface (GUI) that typically employs menus, drop down menus, icons and/or a point-and-click interface via the display 707 and/or user input 708. The media player 700 further includes an audio output 709 such as a speaker and/or audio output jack. The signal processing and/or control circuits 704 and/or other circuits (not shown) of the media player 700 may process data, perform coding and/or encryption, perform calculations, format data and/or perform any other media player function.

Figure 7G:
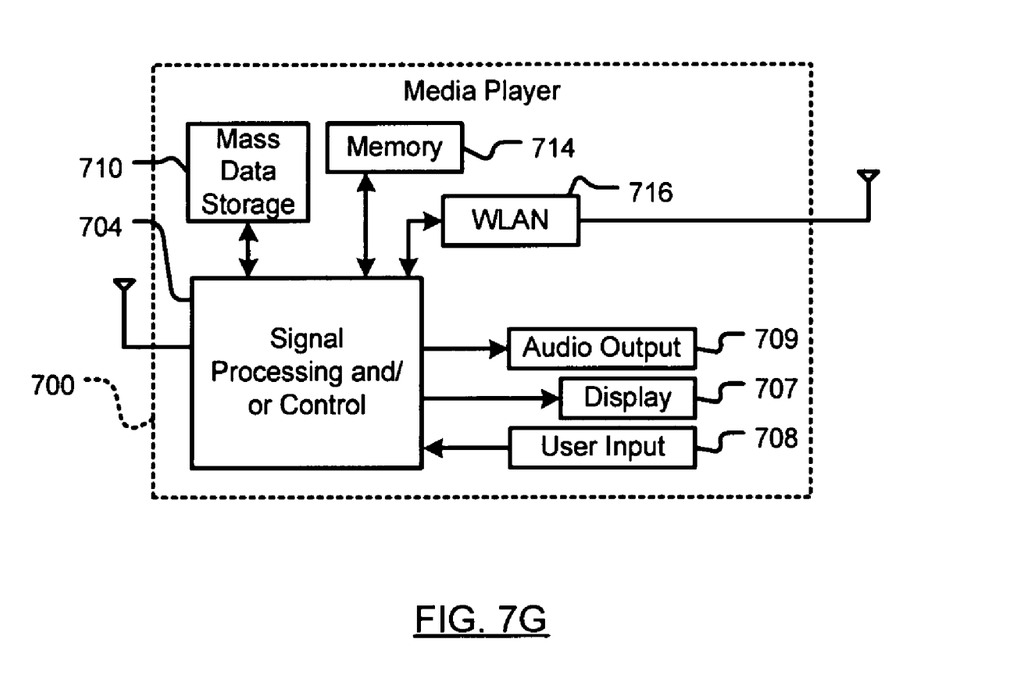

The media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 7A and/or at least one DVD may have the configuration shown in FIG. 7B. The HDD may be a mini HDD that includes one or more platters having a diameter that is smaller than approximately 1.8"The media player 700 may be connected to memory 714 such as RAM, ROM, low latency nonvolatile memory such as flash memory and/or other suitable electronic data storage. The media player 700 also may support connections with a WLAN via a WLAN network interface 716. Still other implementations in addition to those described above are contemplated.

CONCLUSIONS

The present invention concerns circuits, architectures, systems, methods and/or algorithms for increasing voltage controlled oscillator (VCO) operational frequency ranges. In one embodiment, a VCO can include 2n+1 transconductors configured to provide an oscillating signal, where n≧1; a selectable supply voltage coupled to each of the transconductors, where a frequency range of the oscillating signal is related to the selectable supply voltage; and an adjustable input voltage, where a frequency of the VCO depends on a value of the adjustable input voltage. Also, the VCO may include a voltage regulator configured to provide the supply voltage and/or a selecting circuit configured to select a reference voltage (e.g., from the voltage regulator can produce the supply voltage). Embodiments of the present invention can advantageously provide a cost effective approach for enhancing VCO frequency ranges from a singly VCO, suitable for phase-locked loop (PLL) applications.

While the above examples include block level diagrams and MOS transistor implementations of clock generation circuitry, one skilled in the art will recognize that other technologies may also be used in accordance with various embodiments of the invention. Further, one skilled in the art will recognize that current-based and/or voltage-based differential signaling and/or control may also be used in accordance with various embodiments of the invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A voltage controlled oscillator (VCO), comprising:
   2n+1 transconductors configured to provide an oscillating signal, wherein n≧1;
   one or more external device pins configured to provide a voltage supply control signal;
   a voltage selecting circuit configured to receive a plurality of reference voltages and said voltage supply control signal, said voltage selecting circuit further configured to select one of said plurality of reference voltages in response to said voltage supply control signal;
   a voltage regulator coupled to each of said transconductors and said voltage selecting circuit said voltage regulator configured to receive said selected reference voltage from said voltage selecting circuit and provide a supply voltage to each of said transconductors, wherein said supply voltage depends on a value of said selected reference voltage, and a frequency range of said oscillating signal depends on a value of said supply voltage; and
   an adjustable bias voltage coupled to each of said transconductors, wherein a frequency of said VCO depends on a value of said adjustable bias voltage.

2. The VCO of claim 1, wherein said adjustable bias voltage is configured to control a control path coupled to each of said transconductors.

3. The VCO of claim 2, wherein said control path comprises one or more transistors receiving said adjustable bias voltage.

4. The VCO of claim 3, wherein said control path comprises a pull-down path.

5. The VCO of claim 2, wherein said control path comprises, for each of said transconductors, a transistor receiving said adjustable bias voltage and coupled to a respective one of said transconductors.

6. The VCO of claim 1, wherein each of said transconductors comprises a differential transconductor.

7. A method of controlling a frequency of a voltage controlled oscillator (VCO), comprising the steps of:
   receiving a voltage supply control signal at one or more external device pins;
   selecting one of a plurality of reference levels voltages in response to said voltage supply control signal;
   providing a supply voltage to each of (2n+1) transconductors in said VCO, wherein n≧1, and said supply voltage corresponds to a value of said selected reference voltage, and a frequency range of said VCO depends on a value of said supply voltage; and
   inputting an adjustable bias voltage to a control path in said VCO, said control path being coupled to each of said transconductors, and said frequency of said VCO being dependent on said adjustable bias voltage.

8. The method of claim 7, wherein each of said transconductors comprises a differential transconductor.

9. The method of claim 7, wherein said control path comprises a pull-down path through a transistor coupled to each of said transconductors.

10. The method of claim 7, wherein the step of selecting comprises using a voltage regulator to provide said supply voltage in response to a selected reference voltage.

11. The method of claim 10, wherein the step of selecting further comprises using a selecting circuit to select one of said plurality of reference voltages.

12. The method of claim 11, wherein said selecting circuit is configured to receive said plurality of reference levels and said voltage supply control signal, and select one of said reference levels in response to said voltage supply control signal.

13. The method of claim 10, wherein said voltage regulator is configured to receive said selected reference level and provide said supply voltage to each of said transconductors.

14. The method of claim 7, wherein the step of inputting said adjustable bias voltage comprises determining a linear operating range of said VCO.

15. The method of claim 7, further comprising the step of controlling a phase-locked loop (PLL) using said VCO.

16. A phase-locked loop (PLL), comprising:
- a voltage controlled oscillator (VCO) having (2n+1) transconductors, said VCO configured to provide an oscillating signal, wherein $n \geq 1$;
- one or more external device pins configured to provide a voltage supply control signal;
- a voltage selecting circuit configured to receive a plurality of reference voltages and said voltage supply control signal, said voltage selecting circuit further configured to select one of said reference voltages in response to said voltage supply control signal; and
- a voltage regulator coupled to each of said transconductors and said voltage selecting circuit, said voltage regulator configured to receive said selected reference voltage and provide a supply voltage to each of said transconductors, wherein said supply voltage depends on a value of said selected reference voltage, and a frequency range of said oscillating signal depends on a value of said selectable supply voltage.

17. The PLL of claim 16, further comprising a charge pump coupled to said VCO, wherein said charge pump is configured to provide a bias voltage, and a frequency of said VCO is related to said bias voltage.

18. The PLL of claim 17, further comprising a loop filter coupled to said charge pump and said VCO.

19. The PLL of claim 17, wherein said bias voltage is configured to control a control path coupled to each of said transconductors.

20. The PLL of claim 19, wherein said control path comprises a transistor receiving said bias voltage.

21. The PLL of claim 19, wherein said control path comprises, for each of said transconductors, a transistor receiving said bias voltage and coupled to a respective one of said transconductors.

22. The PLL of claim 21, wherein said control path comprises a pull-down path.

23. The PLL of claim 16, wherein each of said transconductors comprises a differential transconductor.

24. An integrated circuit, comprising:
- the PLL of claim 16;
- a first functional block operating at a first frequency and receiving a first clock signal from said PLL; and
- a second functional block operating at a second frequency and receiving a second clock signal from said PLL, the second frequency differing from the first frequency.

25. The integrated circuit of claim 24, wherein said first functional block comprises a memory, and said second functional block comprises a microprocessor.

26. The integrated circuit of claim 24, wherein said first functional block comprises a peripheral component interface, and said second functional block comprises a universal serial bus interface.

27. The integrated circuit of claim 24, comprising a central processing unit, a first memory, a second memory, a plurality of different interfaces, and a coding/decoding block.

28. The integrated circuit of claim 24, wherein said PLL further comprises one or more frequency multipliers and/or dividers.

29. The integrated circuit of claim 28, further comprising a central processing unit receiving a first output of said PLL.

30. The integrated circuit of claim 29, further comprising memory block receiving a second output of said PLL.

31. The integrated circuit of claim 30, further comprising one or more interface blocks receiving one or more third outputs of said PLL.

* * * * *